US009295948B2

(12) United States Patent
Novikov et al.

(10) Patent No.: US 9,295,948 B2
(45) Date of Patent: Mar. 29, 2016

(54) SYSTEM, METHOD AND COMPUTER-ACCESSIBLE MEDIUM FOR DETERMINING MEMBRANE PROPERTIES RELATING TO DIFFUSION

(75) Inventors: Dmitry S. Novikov, New York, NY (US); Jens Jensen, Charleston, SC (US); Joseph A. Helpern, Sullivans Island, SC (US); Els Fieremans, New York, NY (US)

(73) Assignee: New York University, New York, NY (US)

( * ) Notice: Subject to any disclaimer, the term of this patent is extended or adjusted under 35 U.S.C. 154(b) by 1010 days.

(21) Appl. No.: 13/260,445

(22) PCT Filed: Mar. 26, 2010

(86) PCT No.: PCT/US2010/028924
§ 371 (c)(1),
(2), (4) Date: Nov. 28, 2011

(87) PCT Pub. No.: WO2010/111657
PCT Pub. Date: Sep. 30, 2010

(65) Prior Publication Data
US 2012/0095700 A1      Apr. 19, 2012

Related U.S. Application Data

(60) Provisional application No. 61/163,674, filed on Mar. 26, 2009.

(51) Int. Cl.
*G01N 3/30*     (2006.01)
*G01B 9/04*     (2006.01)
(Continued)

(52) U.S. Cl.
CPC .......... *B01D 65/10* (2013.01); *G01R 33/56341* (2013.01)

(58) Field of Classification Search
CPC ...................................... B01D 65/003
USPC ........... 702/19, 21, 29, 31, 33, 104, 107, 152, 702/190; 435/4; 600/414; 606/41
See application file for complete search history.

(56) References Cited

U.S. PATENT DOCUMENTS 6,190,315 B1 *   2/2001   Kost et al. ..................... 600/309
7,747,308 B2 *   6/2010   Hundley et al. ............... 600/414
(Continued)

FOREIGN PATENT DOCUMENTS

EP     1865322     12/2007
EP     1873514     1/2008

OTHER PUBLICATIONS

International Search Report for PCT/US2010/028924 mailed Oct. 29, 2010.
(Continued)

*Primary Examiner* — Gregory J Toatley
*Assistant Examiner* — Felix Suarez
(74) *Attorney, Agent, or Firm* — Andrews Kurth LLP

(57) ABSTRACT

Exemplary embodiments of a methodology, procedure, system, method and computer-accessible medium can be provided to obtain particular information relating to at least one transport property of a material containing at least one membrane, and to determine, e.g., a permeability of the membrane of the material and/or a surface area of the membrane of the material, as a function of, e.g., the obtained particular information.

42 Claims, 6 Drawing Sheets

(51) Int. Cl.
  *G01B 9/06*    (2006.01)
  *G01B 9/08*    (2006.01)
  *B01D 65/10*   (2006.01)
  *G01R 33/563*  (2006.01)

(56) References Cited

U.S. PATENT DOCUMENTS 8,372,600 B2 * 2/2013 Sachs et al. ............... 435/39
2005/0239046 A1 * 10/2005 Sachs et al. ............... 435/4
2007/0121124 A1 5/2007 Nabatova-Gabain et al.
2009/0198231 A1 * 8/2009 Esser et al. ............... 606/41

OTHER PUBLICATIONS

International Written Opinion for PCT/US2010/028924 mailed Oct. 29, 2010.

Cole, K.D., "Electric impedance of suspensions of arbacia eggs," Journal General Physiol, vol. 12, pp. 37-54, Apr. 23, 1928.

* cited by examiner

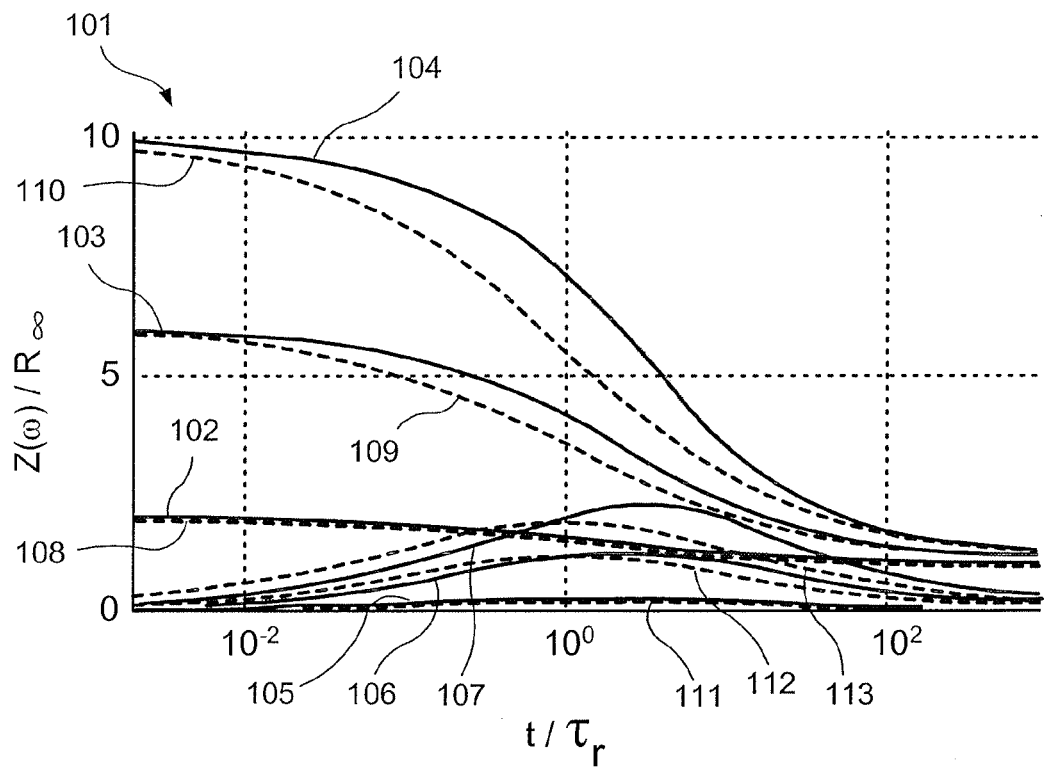
F I G. 1A
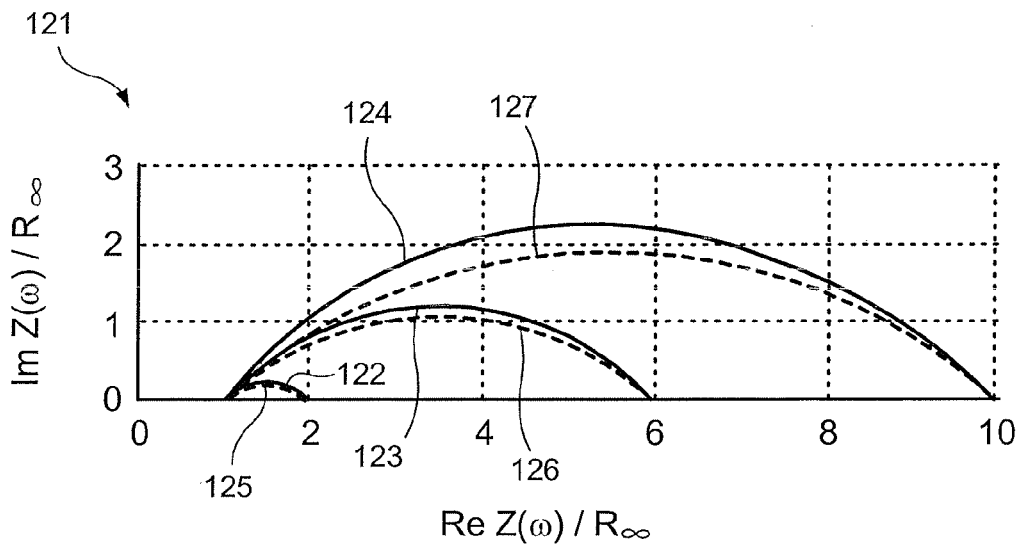
F I G. 1B

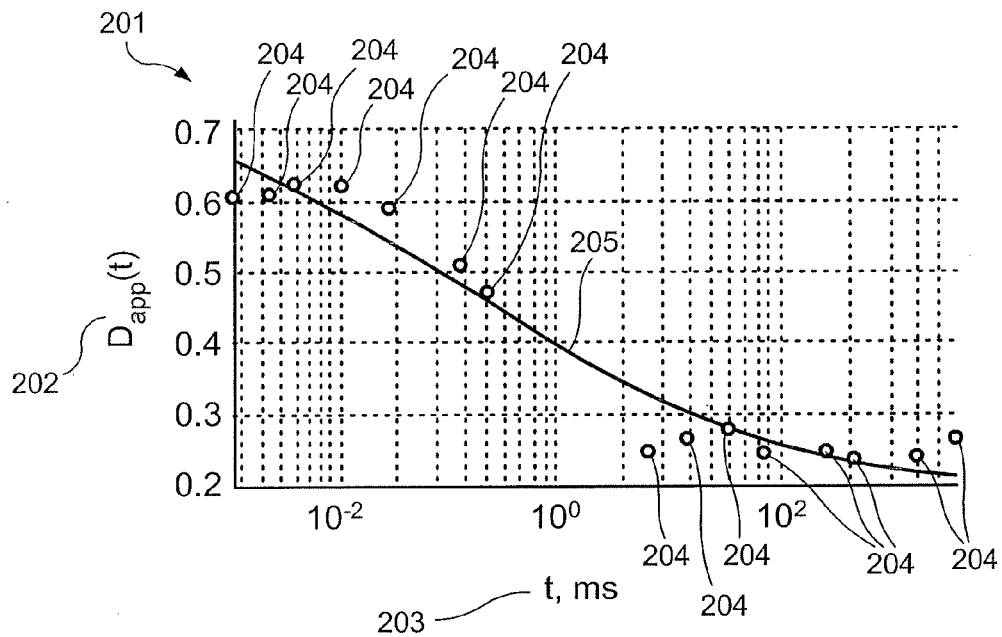
F I G. 2A
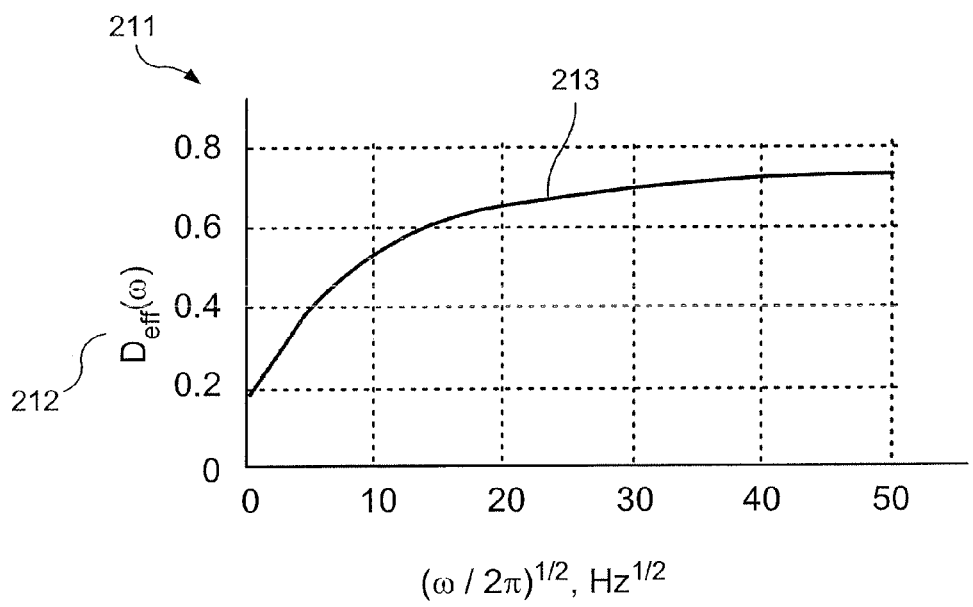
F I G. 2B

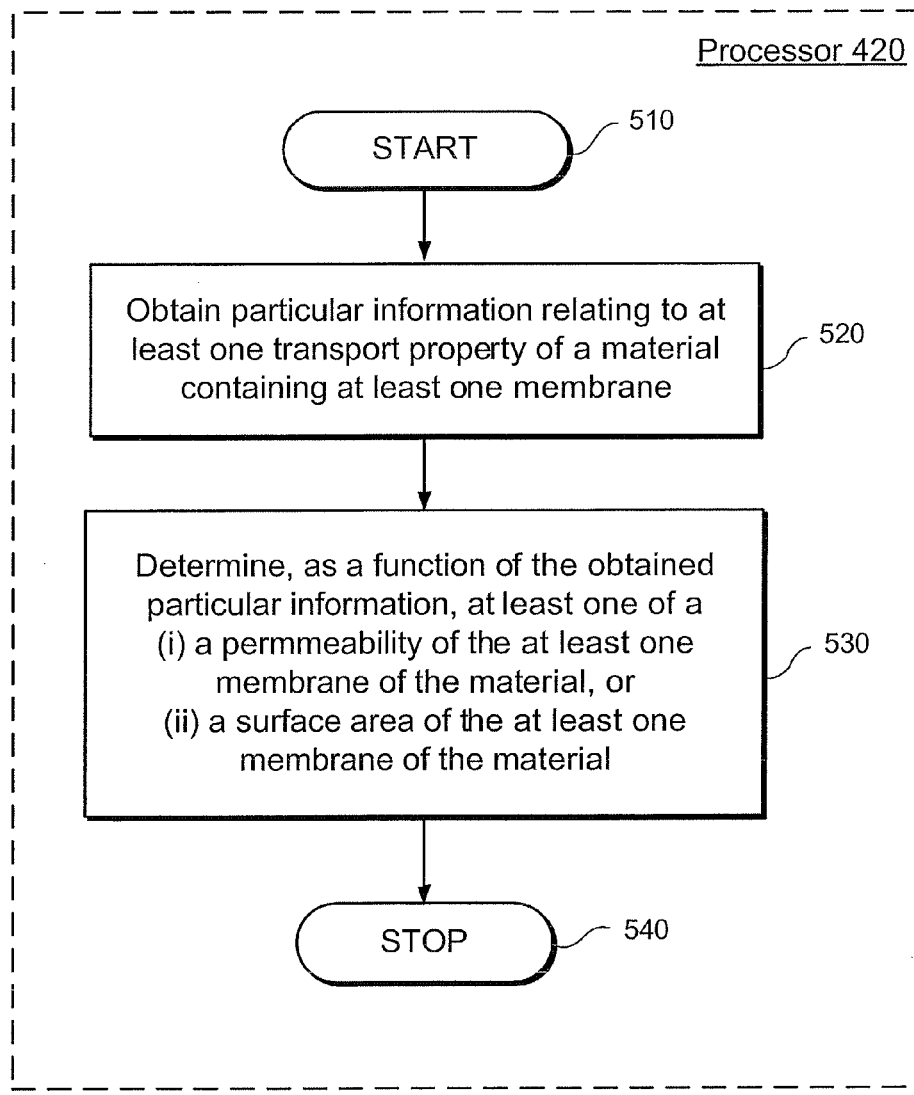
F I G. 5

SYSTEM, METHOD AND COMPUTER-ACCESSIBLE MEDIUM FOR DETERMINING MEMBRANE PROPERTIES RELATING TO DIFFUSION

CROSS-REFERENCE TO RELATED APPLICATION(S)

The present application relates to and claims priority from U.S. patent application No. 61/163,674 filed Mar. 26, 2009, the entire disclosure of which is hereby incorporated herein by reference.

STATEMENT REGARDING FEDERALLY SPONSORED RESEARCH

The present disclosure was developed, at least in part, using Government support under Contract No. 1R01AG027852 awarded by the National Institute of Health and Contract No. 1R01EB007656 awarded by the National Institute of Health. Therefore, the Federal Government may have certain rights in the invention.

FIELD OF THE DISCLOSURE

The present disclosure relates generally to exemplary embodiments of systems, methods and computer-accessible media for, e.g., obtaining information associated with a sample, and more particularly to, e.g., obtaining information relating to at least one transport property of a membrane, and determining further information associated therewith.

BACKGROUND INFORMATION

For several diverse applications in various disciplines, one objective can be, e.g., to determine structural and functional features of a microscopically heterogeneous sample. A wide variety of practically important heterogeneous media, ranging from, e.g., composite materials to, e.g., porous media, e.g., to biological tissues, can be characterized by the presence of barriers (e.g., membranes in biological tissues), which can, e.g., restrict molecular diffusion. In certain cases, the prime characteristics can be, e.g., the total area of and permeability of these barriers, for example.

Direct access to the microscopic structure often can be hindered, e.g., as it may not be possible to probe the diffusion flux of molecules across a barrier in the bulk of the sample without destroying its functionality. This can be a typical situation with biological tissues. For example, the cell membrane permeability to water or ions can play an important role in cell life and functionality, yet direct access to the cell membrane can be hindered. Cell membrane permeability can be measured using optical techniques, e.g., by monitoring the minute change of the refraction index of a cell in response to absorption of water due to osmosis. Such method can be, e.g., limited to cells on a surface of a specimen, and may not be utilized non-invasively in-vivo in the bulk of an organism.

Similar issues can arise, e.g., in non-destructive testing of composite materials, as well as in quantifying properties of carbonate rocks (e.g., via rock porosity and composition) for the purpose of oil exploration, for example.

Accordingly, there may be a need to determine barrier characteristics (e.g., surface area and permeability) from a non-destructive bulk transport measurement, for example.

SUMMARY OF EXEMPLARY EMBODIMENTS OF THE DISCLOSURE

One of the objects of certain exemplary embodiments of the present disclosure can be to address the exemplary problems described herein above, and/or to overcome the exemplary deficiencies commonly associated with the prior art as, e.g., described herein.

For example, provided and described herein are certain exemplary embodiments of exemplary system, method and computer-accessible medium in accordance with the present disclosure which can be used, e.g., to determine exemplary transport properties (.e.g., permeability) of, e.g., composite materials, porous media and biological tissues by, e.g., associated barriers (e.g., membranes).

In accordance with certain exemplary embodiments of the present disclosure, an exemplary computer-accessible medium can be provided having exemplary instructions thereon, where, when an exemplary processing arrangement executes the exemplary instructions, the exemplary processing arrangement can be configured to execute exemplary procedures including obtaining particular information relating to transport properties of a material containing at least one membrane; and determining (i) a permeability of the at least one membrane of the material, and/or (ii) a surface area of the at least one membrane of the material.

According to certain exemplary embodiments of the present disclosure, the exemplary determination can be performed as a function of the obtained particular information, for example. The exemplary particular information can be obtained, e.g., without a direct access to the at least one exemplary membrane, e.g., with a use of an exemplary magnetic resonance imaging (MRI) procedure. The obtained exemplary information can include, e.g., an exemplary frequency-dependent transport characteristic of the material, an exemplary time-dependent transport characteristic of the material, information associated with an exemplary electrical conductivity of the material and/or an exemplary impedance of the material, and/or an exemplary diffusional measurement, which measurement can be, e.g., an exemplary diffusional kurtosis measurement, for example. In addition, the obtained particular information can include, e.g., data received from an exemplary diffusion-weighted imaging (DWI) signal.

Further, according to certain exemplary embodiments, the at least one membrane can include a plurality of membranes which can be, e.g., (i) unordered, (ii) spaced unequally and/or (iii) uncorrelated. Moreover, the exemplary determination procedure can be performed, e.g., by fitting the exemplary particular information to an exemplary function of surface area and/or permeability of the one or more exemplary membranes, for example.

The exemplary diffusional measurement can include, e.g., a diffusional kurtosis measurement, the exemplary computing arrangement can be further configured to utilize at least one of a long-time behavior or a low-frequency behavior with respect to at least one one-dimensional formula using at least one of (i) a measured time-dependent diffusion coefficient, (ii) a frequency-dependent diffusivity, or (iii) a frequency-dependent conductivity. This can be used to determine a parameter that characterizes a ratio of an inter-membrane interval dispersion over a mean inter-membrane interval associated with the at least one membrane, for example.

Another exemplary embodiment of a method in accordance with the present disclosure can be provided, according to which, e.g., particular information relating to transport properties of a material containing at least one membrane can be obtained; and (i) a permeability of the at least one membrane of the material, and/or (ii) a surface area of the at least one membrane of the material can be determined.

An exemplary system in accordance with certain exemplary embodiments of the present disclosure that can also be provided which can include, e.g., an exemplary computer-accessible medium having executable instructions thereon. For example, when at least one computing arrangement executes the instructions, the computing arrangement(s) can be configured to, e.g., obtain particular information relating to transport properties of a material containing at least one membrane; and determine: (i) a permeability of the at least one membrane of the material, and/or (ii) a surface area of the at least one membrane of the material.

These and other objects, features and advantages of the present invention will become apparent upon reading the following detailed description of exemplary embodiments of the present disclosure, when taken in conjunction with the accompanying exemplary drawings and appended claims.

BRIEF DESCRIPTION OF THE DRAWINGS

The foregoing and other objects of the present disclosure will be apparent upon consideration of the following detailed description, taken in conjunction with the accompanying exemplary drawings and claims showing illustrative embodiments of the invention, in which:

FIG. 1A is an exemplary illustration of an exemplary graph showing exemplary real and imaginary parts of an exemplary impedance in accordance with certain exemplary embodiments of the present disclosure;

FIG. 1B is an illustration of an exemplary Cole-Cole graph for the exemplary impedance of FIG. 1A in accordance with certain exemplary embodiments of the present disclosure;

FIG. 2A is an illustration of an exemplary graph of an exemplary time-dependent apparent diffusivity for an exemplary sample in accordance with certain exemplary embodiments of the present disclosure;

FIG. 2B is an illustration of an exemplary graph of an effective dispersive diffusivity for the exemplary parameters associated with the exemplary sample of FIG. 2A;

FIG. 5 is an illustration of a flow diagram of an exemplary procedure executed by a processor in accordance with certain exemplary embodiments of the present disclosure.

Figure 2C:
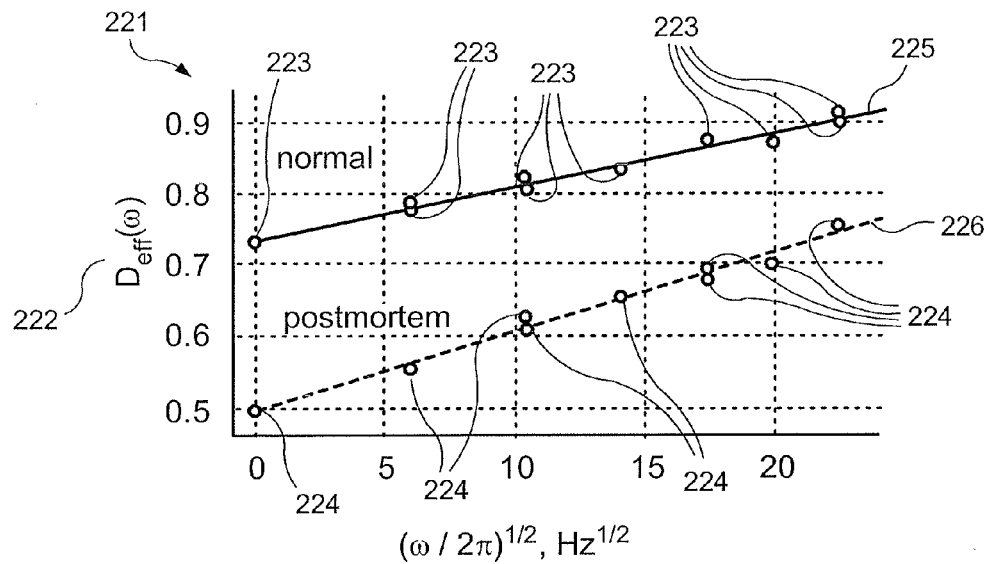
FIG. 2C is an illustration of a graph of an exemplary measurement of an exemplary effective dispersive diffusivity in rat brain gray matter in accordance with certain exemplary embodiments of the present disclosure.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative embodiments. It is intended that changes and modifications can be made to the described embodiments without departing from the true scope and spirit of the subject disclosure.

DETAILED DESCRIPTION OF EXEMPLARY EMBODIMENTS OF THE DISCLOSURE

Exemplary embodiments of the present disclosure can be implemented by exemplary embodiments of system, method and/or computer-accessible medium in accordance with the present disclosure, e.g., as described herein.

For example, certain exemplary embodiments of an exemplary system, method and/or computer accessible medium according to the present disclosure can be provided to address at least some of the above-described deficiencies. For example, using such exemplary embodiments, it can be possible to determine permeability ($\kappa$) and the total surface area (S) of barriers in a sample indirectly, from a transport measurement acquired over a macroscopic sample volume V, which can greatly exceed the size of individual barriers or grains (e.g., cells). One exemplary advantage of certain exemplary embodiments of the system, method and computer-accessible medium in accordance with the present disclosure can be that it is not limited by, e.g., either the spatial resolution (V) of the transport measurement and/or by a need for direct access to the barrier.

Further, certain exemplary embodiments of the system, method and computer-accessible medium according to the present disclosure can relate the transport characteristics measurable via standard experimental techniques, e.g., diffusion-weighted magnetic resonance imaging (MRI) and/or electrical impedance measurement, to the desirable barrier characteristics (permeability and total surface area). For example, certain exemplary embodiments of the system, method and computer-accessible medium can facilitate the use of substantially the same or similar procedures, which, in the case of human MRI, can be FDA approved, in various fields of science to, e.g., acquire additional information for little to no extra investment of time or resources.

According to certain exemplary embodiments, substantially vital and/or important properties of, e.g., composite materials, porous media and biological tissues can be determined by barriers (e.g., membranes) which can restrict molecular diffusion. A related challenge can be, e.g., to characterize membranes without disrupting a material and/or an organism, which can involve relating membrane properties to a bulk transport measurement, for example. An exemplary objective of certain exemplary embodiments of the present disclosure can be, e.g., to solve the problem of a random walk restricted by randomly placed flat membranes.

The permeability and surface area of exemplary membranes can be quantified via two distinct exemplary methods, e.g., an electrical conductivity measurement ($\sigma$), and a diffusion-weighted magnetic resonance (DW-MR) procedure. Exemplary links therebetween can be established and explored. For the electrical conductivity ($\sigma$), Cole's empirical formula for tissue impedance can be derived and generalized. (See, e.g., Cole, K. S., *Electric impedance of suspensions of arbacia eggs*, J. Gen. Physiol, Vol. 12, 37-54 (1928)—the "Cole Publication"). The ubiquitous "constant phase angle" behavior of tissues can be related to membrane properties. For the DW-MR procedure, it can be possible, for example, to characterize cell membranes using water diffusion measurements in red blood cell (RBC) suspensions. Certain exemplary embodiments can facilitate and explain the observed diffusivity dispersion in, e.g., brain gray matter in terms of restrictions by relatively permeable intracellular membranes, and can indicate that the diffusivity drop in an ischemic brain can be caused primarily by reduction in their permeability, for example. Certain exemplary results can be used to non-destructively characterize composite and porous materials, as well as to correlate cell membrane properties with in-vivo tissue physiology and pathology.

Restrictions by barriers (e.g., membranes) can be ubiquitous in nature and in technology. Such restrictions can, for example, determine properties of porous materials, such as carbonate rocks, that can contain a significant portion of the world's oil, be utilized in fuel cell and water purification technologies, and/or be essential and/or important to transport ions, water molecules and gases in biological tissues.

Historically, transport across membranes have typically been studied in the context of biological tissue impedance. In 1930's, the Cole Publication suggested an empirical frequency dependence:

$$Z(\omega) = R_\infty + (R_0 - R_\infty)/[1 + (j\omega\tau)^\alpha] \quad (1)$$

which can be considered to have been successful in describing available experimental data. In particular, $j^2 = -1$, and the power $\alpha$ can likely be measured to be between 0 and 1, clustering around $\alpha = 0.5$, for example.

The nature of the fractional power a generally has not been completely understood, although certain relaxation mechanisms have been proffered. A representation of exemplary equation 1 in terms of, e.g., a Lapicque equivalent circuit (e.g., a resistance and a capacitance in parallel, both in series with another resistance), can correspond to $\alpha = 1$. For fractional $\alpha$, this exemplary representation can use an exemplary mysterious constant phase angle element with impedance $Z^* \sim (j\omega)^{-\alpha}$ instead of the capacitance, for example. Fricke, H.., *The theory of Electrolytic Polarization*, Phil. Mag. 14, 310 (1932) (the "Fricke Publication"), noted as early as in 1932 that the apparent "polarization" in tissues can be similar to that observed at a metal electrode ($\alpha = \frac{1}{2}$) ever since the 19th century works of Kohlrausch, F., *Ueber die elektromotorische Kraft Sehr Dunner Gasschichten auf Metallplatteu*, Pogg. Ann. 148, 143 (1873) and Wien, M. *Ueber die Polarisation bei Wechselstrom*, Ann. Phys. Chem. 58, 294, 37 (1896), and described in the 1899 paper by Warburg. (See, e.g., Warburg, E. Ueber das Verhalten sogenannter unpolrisirbarer Elektroden gegen Wechselstrom, Ann. Phys. (Leipzig) Vol. 303, 493-499 (1899)—The "Warburg Publication"). It is believed, however, that no derivation of, e.g., exemplary Equation 1 has yet been provided to date.

Magnetic resonance imaging (MRI) techniques can, e.g., provide an alternative to analyze transport in permeable media, such as biological tissues. Instead of measuring current in response to an A/C voltage, certain exemplary embodiments of diffusion-weighted MR (DW-MR) can map an exemplary probability distribution function (PDF) of molecular displacements. For example, this mapping can be achieved by, e.g., an application of magnetic field gradients which can encode positions of spin-carrying molecules. Restrictions to diffusion in tissues can originate due to, e.g., a complex architecture, such as cell membranes and intracellular structure. A relation between the measured PDF, which can be strongly non-Gaussian in tissues, and physiological tissue parameters, is also believed as having not yet been established. This unresolved problem can be significant and hinder quantitative interpretation of DW-MR images, for example.

Certain exemplary embodiments of the present disclosure can be related to, at least in part to solving the above-described problem of a random walk restricted by randomly placed membranes. The exemplary solution according to the present disclosure can, e.g., rationalize the non-Gaussian diffusion observed in tissues by DW-MR in terms of restrictions by intracellular membranes, and relate the time-dependent diffusivity to membrane properties. For example, such exemplary solutions can also be used to, e.g., prove and generalize the empirical impedance (e.g., exemplary Equation 1), thereby facilitating a characterization of exemplary membrane surface area and permeability via two distinct techniques and/or procedures, and connect them based on the equivalence between the diffusivity and the conductivity.

An exemplary outcome of an exemplary solution can be as described in the following example. For example, diffusion in d spatial dimensions can be taken, which is restricted by infinitely thin flat membranes with permeability $\kappa$, and randomly embedded in a medium with uniform diffusivity D. After averaging over positions and orientations of the membranes, the effective diffusivity $D_{\text{eff}}(\omega)$ can acquire a characteristic frequency dependence with a $\omega^{1/2}$ singularity, which can be expressed as:

$$\frac{D}{D_{\text{eff}}(\omega)} = 1 + \zeta + 2z(1-z)\left[\sqrt{1 + \zeta/(1-z)^2} - 1\right] \quad (2)$$

where $z = i(i\omega T)^{1/2}$ and $\zeta = (S/V)l/d$. The exemplary effective membrane thickness $2l = D/\kappa$ can represent an exemplary measure of membrane permeability, $T = l^2/D$ can represent the characteristic time for transport across a membrane, and S/V can represent the surface-to-volume ratio. In exemplary Equation 1, it can be that $j = e^{-i\pi/2} = -i$ due to opposite conventions of the temporal Fourier transform among physicists and engineers, e.g. current oscillates as $e^{j\omega t} = e^{-i\omega t}$.

An exemplary derivation of the dispersive diffusivity (e.g., exemplary Equation 2) can proceed in, e.g., two exemplary procedures. First, the perturbative limit can be obtained, which can be expressed as, e.g.:

$$D_{\text{eff}}(\omega) \simeq D\left(1 - \frac{\zeta}{1 - i\sqrt{i\omega\tau}}\right) \quad (3)$$

which can be valid, e.g., in the lowest order in membrane concentration S/V. Second, an exemplary renormalization group argument can be used to determine an exemplary general result (e.g., exemplary Equation 2).

The exemplary dispersive diffusivity $D_{\text{eff}}(\omega)$ and the exemplary impedance $Z(\omega)$ can be inversely related, which can be expressed as, e.g.:

$$Z(\omega)/R_\infty = D/D_{\text{eff}}(\omega) \quad (4)$$

where $R_\infty \sim 1/D$ can represent the exemplary high-frequency resistivity limit corresponding to the absence of membranes. Thus, $D_{\text{eff}}(\omega)$ can be proportional to the electrical conductivity $\sigma(\omega) = 1/Z(\omega)$ in an exemplary case when the diffusing particles are charged. Indeed, the exemplary dispersive diffusivity $D_{\text{eff}}(\omega)$ can link exemplary local current density $J_{\omega,r} = -D_{\text{eff}}(\omega)\nabla_r\psi_{\omega;r}$ to an exemplary gradient of an exemplary particle density $\psi_{t,r} = (2\pi)^{-1}\int d\omega\, e^{-i\omega t}\psi_{\omega;r}$; where, e.g., in the DW-MR, $\psi_{t,r}$ can represent the packet of water molecules "labeled" by the applied magnetic field gradient. In certain exemplary embodiments, similarly, an exemplary dispersive conductivity $\sigma(\omega)$ can relate current density to an exemplary local potential gradient (e.g., electric field), $J_{\omega,r} = -\sigma(\omega)\nabla_r\Phi_{\omega,r}$. An exemplary analogy can be complete for a constant density of states, so that $\omega_{t,r} \propto \Phi_{t,r}$, can hold for good conductors (e.g., where electrostatic screening can occur on a sufficiently short length scale). Thus, the same and/or substantially similar exemplary transport characteristic can be accessible, e.g., via both DW-MR and electrical impedance measurements.

For example, FIG. 1A shows an exemplary illustration of a graph 101 of real and imaginary parts of an exemplary impedance (e.g., exemplary Equation 2) versus an empirical Cole formula (e.g., exemplary Equation 1) for $\zeta = 1, 5, 9$. In particular, solid lines 102, 103, 104 represent the real parts of the exemplary impedance for, e.g., exemplary Equation 2 for $\zeta=1, 5, 9$, respectively. Solid lines 105, 106, 107 represent the imaginary parts of the exemplary impedance for, e.g., exemplary Equation 2 for $\zeta=1, 5, 9$, respectively. Dashed lines 108, 109, 110 represent the real parts for, e.g., exemplary Equation 1 for $\zeta=1, 5, 9$, respectively; and dashed lines 111, 112, 113 represent the imaginary parts for, e.g., exemplary Equation 1 for $\zeta=1, 5, 9$, respectively. One having ordinary skill in the art should appreciate that, e.g., $D_{eff}(-\omega)=D^*_{eff}(\omega)$.

FIG. 1B shows an exemplary illustration of another graph 121 of an exemplary Cole-Cole plot for an exemplary impedance (e.g., exemplary Equation 2) versus the empirical Cole formula (e.g., exemplary Equation 1) for $\zeta=1, 5, 9$. In particular, solid lines 122, 123, 124 represent the exemplary impedance for exemplary equation 2 for $\zeta=1, 5, 9$, respectively. Dashed lines 125, 126, 127 correspond to, e.g., exemplary Equation 1 for $\zeta=1, 5, 9$, respectively. One having ordinary skill in the art should appreciate that the exemplary frequency can grow counterclockwise from $\omega=0$ to $\omega=\infty$, for example.

Thus, as shown in FIGS. 1A and 1B, in accordance with certain exemplary embodiments of the present disclosure, for an exemplary tissue impedance, exemplary Equation 2 can prove and extend Cole's empirical formula (e.g., exemplary Equation 1) with $\alpha=\frac{1}{2}$, and $R_0=(1+\zeta)R_\infty$. For $\zeta\ll1$, the agreement can be exact and/or substantially exact since, in the exemplary perturbative limit, the reciprocal of exemplary Equation 3 can coincide with exemplary Equation 1 ($j^{1/2}=-i^{3/2}$). The exemplary empirical formula (e.g., exemplary Equation 1) can approximate $1/D_{eff}(\omega)$ appropriately since exemplary Equation 2 can yield back exemplary Equation 3 for $(\omega t)^{1/2}\gg\zeta$, where it can match exemplary Equation 1, up to $O(\zeta)$. In the exemplary static limit $\omega\to 0$, the exemplary self-consistent result (e.g., exemplary Equation 2) can yield an exemplary apparent diffusivity $D_0=D/(1+\zeta)$, corresponding to the tortuosity $1+\zeta$, which can coincide with the exemplary result (e.g., exact result) in dimension d=1, and provide a natural mean-field diffusivity estimate in higher dimensions. Certain exemplary embodiments of a system in accordance with the present disclosure can conduct as if the fraction 1/d of membranes (e.g., originating from a directional average) are normal to the current and exert maximal resistance, while the remaining membranes can likely not slow down the transport.

Thus, an exemplary application of the exemplary embodiment of the method in accordance with the present disclosure can correspond to the measurement of the impedance $Z(\omega)$ or of the admittance (e.g., the dispersive conductivity) $\sigma(\omega)=1/Z(\omega)$, and fit to the exemplary result (e.g., exemplary Equation 2) using the exemplary relation (e.g., exemplary Equation 4). Accordingly, one having ordinary skill in the art should appreciate that an exemplary way to measure the surface area and/or permeability of one or more membranes using electrical measurements can thus be provided.

In certain exemplary embodiments of the present disclosure, in an exemplary DW-MR procedure, there can exist two exemplary distinct ways to measure diffusivity. The first one can be to apply pulsed gradients g(t) of an exemplary magnetic field, which can define the wave vector $$q \sim \int_0^t dt' g(t').$$

In such exemplary case, for example, the MR signal $G_{t,q}$ can be a spatial Fourier transform of the PDF $G_{t,r}$ of molecular displacements r during the measurement time t. An exemplary prime diffusion characteristic in this exemplary method can be an apparent diffusion coefficient (ADC) $D_{app}(t)$, which can be defined via the exemplary leading term of the exemplary expansion $\ln G_{t,q}=-D_{app}(t)q^2 t+O(q^4)$.

According to certain exemplary embodiments of the present disclosure, diffusion in a uniform medium can be marked by the linear dependence of $\ln G_{t,q}$ on $q^2$, such that $D_{app}\equiv D$. The pulse-gradient method can be considered to be one of the standards in clinical magnetic resonance imaging (MRI) techniques and/or procedures, and can also be utilized for material characterization, for example. A second exemplary distinct way to measure diffusivity can be to apply oscillating gradients $q(t)\sim e^{-i\omega t}$, in which case the logarithm of the signal can be proportional to an exemplary velocity autocorrelation function corresponding directly to $\text{Re } D_{eff}(\omega)$. These exemplary measurements can be related by the temporal Fourier transform $$G_{t,q} = \int \frac{d\omega}{2\pi} G_{\omega,q} e^{-i\omega t},$$

where the dispersive diffusivity $D_{eff}(\omega)$ can be used to determine the singularity of $G_{\omega,q}=1/[-i\omega+D_{eff}(\omega)q^2+O(q^4)]$, and can cause both non-Gaussian evolution of $G_{t,q}$ and time-dependence of $D_{app}(t)$, such that $$\ln G_{t,q} = -b D_{app}(t) + \frac{1}{6} K(t)[b D_{app}(t)]^2 + \ldots, \quad (5)$$

with, e.g., $b=q^2 t$. The exemplary relation $$D_{app}(t) = -\frac{1}{t}\int \frac{d\omega}{2\pi} \frac{e^{-i\omega t} D_{eff}(\omega)}{(\omega+i0)^2} \quad (6)$$

can facilitate an exemplary numerical determination of an exemplary time-dependent ADC $D_{app}(t)$ from the exemplary diffusivity (e.g., exemplary Equation 2).

For example, a first exemplary application can be the universal short-time expansion of the kurtosis defined in, e.g., exemplary Equation 5, based on which $$K(t)\bigg|_{t\ll\tau} \simeq \frac{s}{V}\beta_d\left[\frac{8\sqrt{Dt}}{5\sqrt{\pi}} - 2kt\right]$$

can behave as, e.g., with $\beta_d=\langle\cos^4\theta\rangle=1, \frac{3}{8}, \frac{1}{5}$ for d=1, 2, 3. This exemplary result can be provided from the exemplary universal limit (e.g., exemplary Equation 3)

$$D\left[1 - \frac{s}{Vd}\left(\frac{4\sqrt{Dt}}{3\sqrt{\pi}} - kt\right)\right],$$

and can be relatively more sensitive to permeability than, e.g., a conventional short-time limit of the ADC, $D_{app}(t)\cong$, which can also follow from the exemplary universal limit (e.g., exemplary Equation 3). Thus, an exemplary measurement of the kurtosis and fitting the exemplary results to the above short-time limit can provide an exemplary method and/or procedure for determining surface area and permeability of membranes, for example.

As indicated herein, a focus on the diffusivity measurements in tissues can be provided in accordance with certain exemplary embodiments of the present disclosure. For example, it can be demonstrated how using a general method based on the exemplary result (e.g., exemplary Equation 2) and/or its consequences such as $D_{app}(t)$ (e.g., exemplary Equation 6), exemplary membrane properties can be quantified. Exemplary membranes can be a dominant cause for a non-Gaussian diffusion that can be observed in tissues. Exemplary roles that membranes can play in an ADC drop during acute ischemia is also described herein.

FIGS. 2A and 2B show exemplary illustrations of graphs related to, e.g., apparent diffusivity coefficient (ADC) and dispersive diffusivity in tissues measured by a diffusion-weighted magnetic resonance (DW-MR) in accordance with certain exemplary embodiments the present disclosure.

In particular, FIG. 2A shows an exemplary illustration of another graph 201 of an exemplary apparent diffusivity $D_{app}$(t) 202 measured in exemplary packed red blood cell (RBC) samples and plotted against time (t) 203, generating a curve 204 from plots 205. For example, nonlinear fitting of the data to $D_{app}$(t), obtained numerically from, e.g., exemplary Equation 2 according to exemplary Equation 6 can yield, e.g., T≈64 ms and Θ≈3.5. This can provide the exemplary RBC membrane permeability $\kappa_{RBC}$≈0.055 μm/ms and the ratio S/V≈1.5 μm$^{-1}$, which can be consistent with other measurements. The exemplary time scale T can mark the onset of what can be distinctly slow long-time asymptotic behavior $D_0-D_{app}(t)\sim t^{-1/2}$, for example.

FIG. 2B shows an exemplary illustration of yet another graph 211 providing exemplary values of effective dispersive diffusivity $D_{eff}(\omega)$ 212, represented by a curve 213, for the exemplary parameters associated with the RBC sample of the graph 201 illustrated in FIG. 2A.

FIG. 2C shows an exemplary illustration of still another graph 221 of a measurement of an exemplary effective dispersive diffusivity $D_{eff}(\omega)$ 222 in rat brain gray matter. The exemplary results can fall into the exemplary low-frequency limit of exemplary Equation 2, $D_{eff}\approx D_0+const\sqrt{\omega}$. The exemplary measured effective dispersive diffusivity $D_{eff}(\omega)$ values 223, 224 for an exemplary "normal" and "postmortem" brain, respectively, can be at least substantially proportional to an exemplary singularity characteristic $\sqrt{\omega}$ in the whole (and/or substantially the whole) exemplary measurement range (e.g., of up to approximately 1 kHz), as illustrated by lines 225, 226 (for the exemplary "normal" and "postmortem" brain, respectively). The exemplary observed behavior of the effective dispersive diffusivity $D_{eff}(\omega)$ can be due to, e.g., exemplary membranes, which can be uniquely characterized by the $\omega^{1/2}$ exemplary singularity, as described herein. One having ordinary skill in the art should appreciate that these exemplary membranes can be significantly more permeable than the exemplary cell (plasma) membranes. Otherwise, the exemplary $\omega^{1/2}$ behavior of $D_{eff}(\omega)$ could have flattened out, e.g., around $\omega_*\sim\max\{1,\zeta^2\}/\tau$, which for the exemplary RBC sample discussed herein above can correspond to $\omega_*/2\pi\approx 30$ Hz. (See, e.g., FIG. 2B).

The exemplary relation $D_{eff}(\omega)\simeq D_0+const\sqrt{\omega}$ for the exemplary normal and postmortem brain in the exemplary illustration of FIG. 2C, can involve at least one of the three parameters (D, τ or ζ) in, e.g., exemplary Equation 2 being fixed before fitting. For example, according to certain exemplary embodiments of the present disclosure, if the exemplary measurement were to extend beyond the cutoff frequency $\omega_*$, the exemplary fitting can be well-defined. The natural candidate to fix in both cases can be the exemplary "bare" diffusivity D. While the absolute values of S/V and κ can depend on the choice of D, for an exemplary fixed value of D anywhere between, e.g., approximately 1.5 μm$^2$/ms and approximately 3.0 μm$^2$/ms, the exemplary S/V values can be approximately similar in both normal and postmortem brain cases, whereas the exemplary permeability κ can be reduced by a factor of about two in the postmortem case. For example, for D=1.6 μm$^2$/ms, the values S/V≈6.7 μm$^{-1}$ in both normal and postmortem brain can coincide. This can be a reasonable diffusivity value for exemplary cell plasma without membranes at 37 C, for example. This exemplary choice of D can yield the values T≈0.17 ms and ζ≈1.2, corresponding to the permeability κ≈1.5 μm/ms in the exemplary normal brain, and T≈0.62 ms and ζ≈2.2 corresponding to κ≈0.80 μm/ms in the exemplary globally ischemic brain, for example.

The abundance of relatively permeable membranes (e.g., κ>10 $\kappa_{RBC}$) can demonstrate that it can be intracellular membranes that can be surrounding the cell organelles such as the nucleus, mitochondria, the endoplasmic reticulum, etc., which can likely provide the predominant restrictions to water motion in gray matter, for example.

Figure 2D:
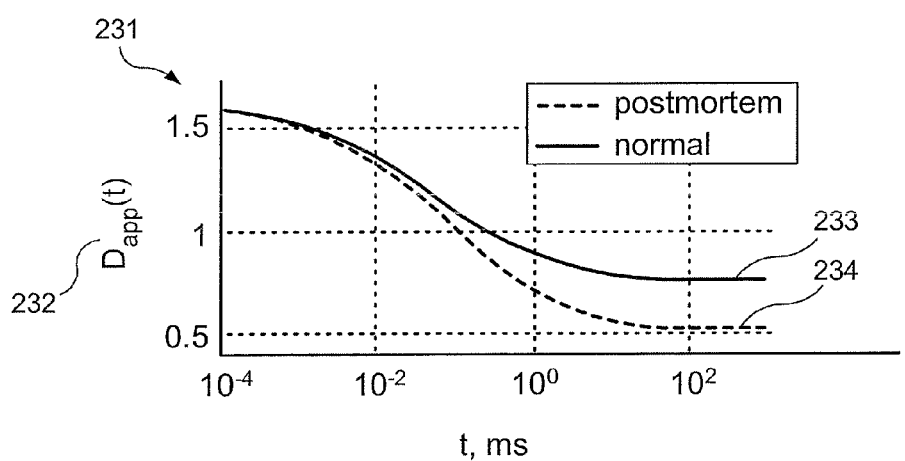
FIG. 2D is an illustration of an exemplary graph of an exemplary apparent diffusion coefficient and an exemplary dispersive diffusivity in tissues measured by diffusion-weighted magnetic resonance in accordance with certain exemplary embodiments of the present disclosure.

FIG. 2D shows an exemplary illustration of yet a further graph 231 in which can be seen that the concentration (e.g., S/V) of exemplary membranes can remain practically intact. A drop in apparent diffusivity (ADC) $D_{app}$(t) 232 of exemplary curves 233 and 234 for this exemplary normal and postmortem case, respectively, can correspond to, e.g., the reduction in their permeability by a factor of about two, according to certain exemplary embodiments of the present disclosure. This role of the exemplary membranes reducing the intracellular diffusivity naturally can bridge two previously suggested exemplary mechanisms of an exemplary ADC drop in stroke, e.g., permeability decrease, and reduction of intracellular water motion.

The exemplary time dependence of $D_{app}$(t) corresponding to the exemplary parameters of this example shown in the exemplary graph 231 of FIG. 2D can be substantially and/or practically flat for exemplary typical pulse-gradient measurement times for t equal to approximately 10 ms to approximately 100 ms. This exemplary result can also provide for what can be considered to be a surprising lack of time dependence, as observed in certain exemplary embodiments of the present disclosure, e.g., in vivo DW-MR ADC measurements.

To place the above exemplary results in context of the exemplary tissue impedance measurements, the time scale T~0:1 ms can correspond to the characteristic frequencies ~10 kHz for which the Cole formula (e.g., exemplary Equation 1) can be estimated and, in particular, for which Im Z(ω) can peak (see, e.g., FIG. 1A). According to certain exemplary embodiments of the present disclosure, this can be because the exemplary free diffusivity D for water and for ions such as Na$^+$ or K$^+$ can be of the same order. The same can be the case for exemplary intracellular membrane permeabilities, as these exemplary membranes can be considered to be passive and to not maintain the ion gradients (as opposed to, e.g., an outer cell membrane). Thus, both exemplary transport techniques, e.g., the exemplary electrical impedance measurements and the exemplary DW-MR, can be used for studying exemplary transport restricted by the same exemplary objects, e.g., the intracellular membranes.

For exemplary practical applications in exemplary biological tissues, exemplary transport in the extracellular space (ECS) can dominate in the static limit, e.g., ω→0. For example, the main effect can be to increase the long-time ADC limit $D_0$, and correspondingly decrease the resistivity $R_0$. An exemplary approach can be provided for finite ECS tortuosity by including, e.g., spatial variations of diffusivity into the disorder-averaging technique, utilized as described herein.

An exemplary solution to the problem of diffusion restricted by random membranes can, e.g., explain and generalize the Cole's empirical impedance form (e.g., exemplary Equation 1), rationalize the apparent non-Gaussian evolution of the DW-MRI signal in tissues in terms of restrictions by intracellular membranes, provide ways to quantify membrane properties in vivo, provide that the biophysical origin of the diffusivity drop in an exemplary acute stroke, and connect transport phenomena and exemplary techniques and/or procedures for characterizing heterogeneous samples with restrictions.

Certain Exemplary Methods

For example, a single exemplary membrane at the origin in one dimension can be considered. The exemplary membrane can impose the following exemplary membrane boundary condition for the particle density $\psi(t, x)$ $$D\partial_x \psi|_{x=0} = \kappa[\psi|_{x=+0} - \psi|_{x=-0}] \tag{7}$$

At the exemplary membrane, an exemplary density discontinuity can be related to an exemplary particle current $J=D\partial_x\psi$, whereas the first and second derivatives of the exemplary density can be continuous, for example. The exemplary boundary condition (e.g., exemplary Equation 7) can be represented as a right-hand side of the diffusion equation for $\psi$, $$\partial_t \psi = D\partial_x^2 \psi + \hat{V}_x \psi = -2Dl\delta'(x)[\partial_x \psi]_{x=0} \tag{8}$$

In this exemplary case, $\delta'(x)$ can be the derivative of an exemplary Dirac delta-function at the position of the membrane, for example.

In certain exemplary embodiments, Green's function $\mathcal{G}_{t;x,x'}$ of the exemplary problem (e.g., exemplary Equation 8) can be defined, e.g., by the initial condition $?_{t;x,x'}|_{t=0}\delta(x-x')$. As the problem can be stationary, it is possible to shift to an exemplary frequency domain, $\partial_t \to -i\omega$. In this exemplary representation, the Green's function $\mathcal{G}_{\omega;x,x'}$ can formally be an operator inverse, which can be expressed as, e.g.:

$$\mathcal{G}_\omega = [\mathcal{G}_\omega^{(0)-1} - \hat{V}]^{-1} \tag{9}$$

where the exemplary coordinates x can play a role of exemplary indices in an infinite-dimensional matrices, and an exemplary free propagator:

$$\mathcal{G}_{\omega,q}^{(0)} = \frac{1}{-i\omega - Dq^2} \tag{10}$$

The exemplary result of inversion (e.g., exemplary Equation 9) can be, e.g., the Born series, which can be expressed as, e.g.:

$$\mathcal{G}_{\omega;x,x'} = \mathcal{G}_{\omega;x-x'}^{(0)} + \int dx_1 \mathcal{G}_{\omega;x-x_1}^{(0)} V_{\omega;x-x_1} \mathcal{G}_{\omega;x_1-x'}^{(0)} \tag{11}$$

where an exemplary key quantity, which can be called "full vertex", can satisfy the Dyson equation, for example, which in the Fourier representation can read as, e.g.:

$$V_{\omega;k,k'} = V_{k,k'} + \int \frac{dq}{2\pi} V_{k,q} G_{\omega,q}^{(0)} V_{\omega;q,k'} \tag{12}$$

In this exemplary case, the exemplary bare vertex can be separable and expressed as, e.g.

$$\hat{V} \to V_{k,k'} = 2Dlkk' \tag{13}$$

Accordingly, for the exemplary solution of exemplary Equation 12, the full vertex can be expressed as, e.g.:

$$V_{\omega;k,k'} = \frac{2Dlkk'}{1 - i\sqrt{i\omega\tau}} \tag{14}$$

The exemplary $\sqrt{\omega}$ dependence of the exemplary vertex represented by exemplary Equation 14 can be an exemplary signature of one-dimensional character of the exemplary problem in the direction normal to the membrane (e.g., independent of what is the spatial dimensionality d). This can be traced back to, e.g., the result from the Warburg Publication as well as to a similar exemplary energy dependence of a scattering amplitude for a short-range potential in one-dimensional quantum mechanics.

Exemplary averaging over positions of randomly placed membranes with concentration n can be done in a standard way by introducing the self-energy part $\Sigma_{\omega,q}$, $$G_{\omega,q}^{-1} = G_{\omega,q}^{(0)-1} - \Sigma_{\omega,q} \tag{15}$$

On an exemplary mean-field level, it is possible to keep in $\Sigma_{\omega,q}$ only the exact interaction vertex with a single membrane, $$\Sigma_{\omega,q} = nV_{\omega;q,q} \tag{16}$$

The exemplary mean-field approximation can be correct in the first order in membrane concentration n=S/2V, and can fail for sufficiently large times when correlations due to interaction with multiple membranes can become important.

The exemplary self-energy can shift the pole of the exemplary propagator $G_{\omega,q}$, thereby changing the diffusive dynamics that can be due to, e.g., disorder-averaged interaction with random membranes. On this level, there likely can be no higher-order terms in powers of $Aq^2$. This can facilitate an exemplary representation of an exemplary interaction with membranes solely as renormalization of the effective diffusivity $D \to D_{eff}(\omega)$ which can acquire frequency dependence dictated by that of the vertex (e.g., exemplary Equation 14), for example.

In higher dimensions (e.g., d>1), exemplary averaging can be performed over positions of membrane in the direction n normal to its surface, and over its orientations. This can amount to an exemplary frequency shift $i\omega \to i\omega(q) = i\omega - Dq_{\parallel}^2$, $\Sigma_{\omega,q;n} = (S/2V)V_{\omega(q);qn,qn}$, with $q_{\parallel} = q - (qn)n$ representing an exemplary embodiment of an exemplary conserved momentum that can be parallel to an exemplary membrane, and subsequent orientational average $\Sigma_{\omega,q} \equiv \langle \Sigma_{\omega,q;n} \rangle_n$, for example.

The exemplary dispersive diffusivity (e.g., exemplary Equation 2) can then be derived from the perturbative limit (e.g., exemplary Equation 3) by utilizing the following exemplary self-consistency argument. If the exemplary diffusivity $D_{eff}(\omega)|_n$ is known at a given membrane concentration n, a small amount $\delta n$ of membranes can be added, and the rest of the exemplary system can be treated as approximately uniform with the exemplary effective diffusivity $D_{eff}(\omega)|_n$, the relation (e.g., exemplary Equation 3) can be used to obtain an exemplary embodiment of diffusivity for increased membrane concentration, which can be expressed as:

$$D_{eff}(\omega)|_{n+\delta n} = D_{eff}(\omega)|_n \left[ 1 - \delta n \frac{D_{eff}(\omega)|_n / d}{k - \frac{i}{2}\sqrt{i\omega D_{eff}(\omega)|_n}} \right] \tag{17}$$

In accordance with certain exemplary embodiments of the present disclosure, since the exemplary membrane positions can be uncorrelated, adding a small amount of membranes in an uncorrelated way at each step can be consistent. An exemplary selection of an infinitesimal δn, exemplary Equation 17 can be represented in a differential form, akin to, e.g., real-space renormalization group (RG), $$\frac{dD_{eff}(\omega)}{dn} = -\frac{D_{eff}^2(\omega)/d}{k - \frac{i}{2}\sqrt{i\omega D_{eff}(\omega)}} \quad (18)$$

Integrating exemplary equation 18 can yield the self-consistent result found in exemplary Equation 2, for example.

The above-described exemplary approach can presume that the exemplary boundary condition (e.g., exemplary Equation 7) can be adjusted accordingly, e.g., $D \rightarrow D_{eff}(\omega)|_n$. This can be valid for sufficiently small frequencies, e.g., $\sqrt{D_{eff}/\omega} \gg 1/n$, corresponding to diffusing past many membranes, when the exemplary system can be treated as an exemplary uniform effective medium at each RG step, for example. For the exemplary case of relatively large frequencies, the exemplary full result (e.g., exemplary Equation 2) can match the exemplary exact $\sqrt{\omega\tau} \gg \zeta$ limit (e.g., exemplary Equation 3), corresponding to the exemplary original boundary condition (e.g., exemplary Equation 7). Thus, keeping the frequency as a parameter in exemplary equation 18 can be, e.g., a posteriori justified.

In certain exemplary embodiments of the system, method and computer accessible medium according to the present disclosure, the diffusion propagator that can be in a medium with randomly placed permeable membranes can be determined. The exemplary effective diffusivity can become dispersive with an exemplary characteristic $\sqrt{\omega}$ singularity, which can lead to exemplary non-Gaussian features in an exemplary probability distribution function for random walkers displacement, for example. The exemplary result can be applied to quantify a variety of complex media such as, e.g., composite materials, porous media and living tissues.

For example, certain exemplary embodiments can relate to, e.g., the exemplary frequency-dependent diffusivity $D_{eff}(\omega)$, the exemplary frequency-dependent conductivity $\sigma(\omega)$ (admittance), the exemplary time-dependent diffusivity D(t), the exemplary time-dependent diffusivity D(t), the exemplary kurtosis K(t), the exemplary permeability κ, the exemplary bulk diffusivity D in the absence of barriers, and/or the exemplary ratio S/V of the total surface area S of barriers to the known sample volume V. Indeed, one having ordinary skill in the art would understand that such exemplary embodiment can be applicable and/or appropriate for the particular case and related particulars, for example.

The exemplary effective dimensionality d can be the number of spatial dimensions in which the positions and orientations of barriers can be approximated as random. According to certain exemplary embodiments of the present disclosure, this exemplary parameter can be determined at the outset. For example, for imaging a brain, white matter fibers (e.g., for practical purposes, the properties along the fiber) can not vary (e.g., within a voxel), while across the cross-section of a fiber, it can be possible to locate exemplary membranes of exemplary fiber-forming axons with some or all possible orientations. Thus, in this example, the exemplary effective dimensionality d=2 can be that of the cross-sectional area of the exemplary sample (e.g., fiber). In an exemplary case when a medium can be composed of a sequence of flat barriers that can be parallel to each other at approximately random distances from one another, the exemplary effective dimensionality d=1 can be that of the exemplary direction normal to most, substantially all and/or all of the barriers.

According to certain exemplary embodiments of the present disclosure, an exemplary procedure to determine barrier characteristics can depend on the particular kind and/or type of the exemplary transport measurement. For example, four different kinds of exemplary measurements to illustrate different exemplary uses of certain exemplary embodiments of the present disclosure are disclosed, described and considered herein as follows.

A. Exemplary Measurement of Frequency-Dependent Diffusivity $D_{eff}(\omega)$

According to certain exemplary embodiments of the present disclosure, an exemplary frequency-dependent (dispersive) diffusivity $D_{eff}(\omega)$ can be measured using an exemplary procedure of oscillating gradients based on diffusion-weighted MRI, or related electron spin resonance imaging (ESRI). For example, such exemplary procedures can facilitate an exemplary measurement of diffusivity of water or of any other compound that has unpaired nuclear or electron spin that can be excited and monitored using, e.g., nuclear magnetic resonance (NMR) or electron spin resonance (ESR) procedure(s).

The output of this exemplary measurement, e.g., the dispersive diffusivity $D_{eff}(\omega)$, where ω can represent the circular frequency of an exemplary oscillating gradient, can be fitted to the real part of exemplary Equation 2 (disclosed and described herein above). Exemplary fitting can be performed by a standard nonlinear fitting technique such as, e.g. the function lsqcurvefit from the MATLAB software package. From an exemplary nonlinear fit, it is possible to obtain the exemplary parameters D, ξ and τ. From such exemplary parameters, using the exemplary description provided after the initial disclosure herein above of exemplary Equation 2, it is possible to determine the exemplary permeability κ and the exemplary surface area S of the exemplary barriers.

B. Exemplary Measurement of Exemplary Frequency-Dependent Conductivity $\sigma(\omega)$ According to certain exemplary embodiments of the present disclosure, exemplary electrical frequency-dependent conductivity $\sigma(\omega)$ (which can be called and/or referred to as, e.g., admittance and/or inverse of impedance) can be a standard characteristic of a medium that can conduct electric current. This exemplary procedure can involve, e.g., measuring an electric current in response to an exemplary applied voltage oscillating at exemplary circular frequency ω. Indeed, this exemplary procedure can be applied to measure transport of charged particles (e.g., ions in an electrolyte). The exemplary system, method and computer-accessible medium in accordance with the present disclosure can then provide the permeability of barriers for the exemplary particular charged particles (e.g., ions). For example, an exemplary estimate of cell membrane permeability for, e.g., sodium or potassium ions from an exemplary electrical impedance measurement in biological tissues can be obtained.

In accordance with certain exemplary embodiments of the present disclosure, an exemplary procedure can substantially repeat the exemplary procedure disclosed and described herein above in, e.g., Section A, and with exemplary diffusivity D being substituted by exemplary conductivity σ. For example, it is possible to fit the exemplary measured admittance σ(ω) to, e.g., exemplary Equation 2, where the exemplary $D_{eff}(\omega)$ can be substituted by the exemplary admittance σ(ω), and the exemplary unrestricted bulk diffusivity D can be substituted by the exemplary bulk conductivity σ of an electrolyte in the absence of barriers. From an exemplary nonlinear fit, it is possible to, e.g., obtain the exemplary parameters σ, ξ and τ. From such exemplary parameters, using, e.g., the exemplary description provided after the initial disclosure herein above of, e.g., exemplary Equation 2, it is possible to determine the exemplary permeability κ and the exemplary surface area S of the barriers, for example.

C. Exemplary Measurement of Exemplary Time-Dependent Diffusivity D(t)

An exemplary procedure in accordance with certain exemplary embodiments of the present disclosure can be based on diffusion-weighted MRI. Such exemplary procedure can determine the exemplary time-dependent diffusion coefficient D(t) of exemplary spin-carrying molecules (e.g., water molecules in the most common in-vivo applications) as a function of experimentally controllable exemplary diffusion time t, for example. With the exemplary measured function D(t), it is possible to fit such exemplary measured function to $D_{app}(t)$, which can be numerically obtained from, e.g., exemplary Equations 5 and 6 disclosed and described above. For example, such exemplary fit procedure can use one or more exemplary standard nonlinear fitting procedures. The exemplary parameters D, ξ, τ can thus be determined accordingly, from which, using, e.g., the exemplary description provided after the initial disclosure herein above of exemplary Equation 2, it is possible to determine the exemplary permeability κ and the exemplary surface area S of the barriers, for example.

D. Exemplary Measurement of Time-Dependent Diffusivity D(t) and Kurtosis K(t)

Exemplary embodiments in accordance with the present disclosure of exemplary diffusional kurtosis imaging (DKI) can yield exemplary time-dependent kurtosis K(t) in addition to exemplary time-dependent diffusivity D(t), such as described herein above in, e.g., Section 3, for example. This additional exemplary information can be used for, e.g., increasing the accuracy and/or speed of an exemplary evaluation of the barrier characteristics. For example, exemplary simultaneous nonlinear fitting of an exemplary measured $D_{meas}(t)$ and $K_{meas}(t)$ (see, e.g., exemplary Equations 5 and 6), and the expressions described herein above can facilitate an exemplary determination of the exemplary parameters D, ξ, τ. This can be preferable to, e.g., determine an exemplary permeability and surface area using an exemplary single measurement time t. For example, according to certain exemplary embodiments of the present disclosure, exemplary fitting can be performed by, e.g., minimizing the least-squares sum $[D_{meas}(t)-D(t)]^2+[K_{meas}(t)-K(t)]^2$ over an exemplary parameter space of D, ξ and τ.

Although certain exemplary embodiments of system, method and computer-accessible medium in accordance with the present disclosure can provide for several different kinds and/or types of applications, certain exemplary applications are described herein as follows, for example.

Exemplary cell membrane permeability from an exemplary diffusion-weighted MRI measurement, using an exemplary embodiment of an exemplary system, method and/or computer-accessible medium disclosed and described herein above in, e.g., Sections A, C and/or D. An exemplary outcome can be, e.g., exemplary permeability and/or exemplary surface area maps for cell membranes in various organs. Such exemplary maps can be used on, e.g., in-vivo tissue physiology and/or pathology, with a variety of applications in and/or related to, e.g., medical diagnostics, treatment, and/or drug delivery.

Exemplary cell membrane permeability from an exemplary impedance measurement, using an exemplary embodiment of the system, method and/or computer-accessible medium described herein above in, e.g., Section B. Such exemplary embodiment according to the present disclosure can be applied to an exemplary research application, which can involve implanting electrodes and/or driving a relatively small exemplary electric current across at least a part of a tissue to obtain an exemplary admittance σ(ω), for example.

Exemplary non-destructive testing of exemplary permeable membranes in composite materials (e.g., plastics, fuel cells, etc). An exemplary application can involve, e.g., proton-conducting membranes in fuel cells. An exemplary impedance measurement, as described herein above in, e.g., Section B, can be utilized to monitor an exemplary performance of exemplary proton-conducting membranes, which can be, e.g., significant in the design, manufacture, testing, operation, etc. of fuel cells.

Exemplary quantifying porosity of sedimentary rocks for exemplary characterizing carbonate reservoirs to, e.g., evaluate potential efficiency of oil production. For example, it can be possible to measure exemplary frequency-dependent or time-dependent diffusion properties, such as described herein above in, e.g., Sections A, C and D, to determine the surface-to-volume ratio S/V which can be an important characteristic of rocks. It is believed that, heretofore, only a measurement of the short-time dependent diffusion coefficient D(t) can have been used. Exemplary embodiments of the system, method and/or computer-accessible medium in accordance with the present disclosure can provide an alternative procedure, which can also be more sensitive than a measurement of the short-time dependent diffusion coefficient D(t). Such exemplary alternative procedure can include measuring an exemplary time-dependent kurtosis K(t), such as described herein above, and/or an exemplary dispersive diffusivity $D_{eff}(\omega)$, as described herein above, for example. In certain exemplary embodiments in accordance with the present disclosure, the membranes can be impermeable, e.g., κ=0, and an exemplary model and/or procedure can be applicable for short times (e.g., high frequencies). Thus, for example, when the exemplary oscillating-gradient MRI method and/or procedure described herein above in, e.g., Section 1, is used, it is possible to fit the exemplary high-frequency limit of exemplary equation 2, which can be expressed as, e.g., $D_{eff}(\omega)=D[1-i(S/Vd)/(i\omega/D)^{1/2}]$ (practically, e.g., the real part of the above expression), to the measured exemplary $D_{eff}(\omega)$.

In substantially the same or similar manner, certain exemplary embodiments of the system, method and/or computer-accessible medium according to the present disclosure of such as described herein above in, e.g., Sections C and D, can be modified so that exemplary short-time limits of exemplary time-dependent diffusivity and/or kurtosis can be utilized. Nonlinear fitting to exemplary expressions for D(t) and K(t) in the limit t<<τ (e.g., the exemplary expressions described herein above), can provide a preferred surface-to-volume ratio S/V for impermeable pore walls in sedimentary rocks, for example.

Exemplary quantifying surface area of, e.g., catalyst supports, plastics and other porous materials. According to certain exemplary embodiments of the present disclosure, substantially the same and/or similar exemplary systems, methods and/or computer-accessible medium to those described herein above for sedimentary rocks can be applied to cases involving the quantification of surface area of, e.g., catalyst supports, plastics and other porous materials.

Exemplary diffusion-weighted MRI of hyperpolarized gases for quantifying surface area and permeability. For example, exemplary applications involving exemplary diffusion-weighted MRI of hyperpolarized gases for quantifying surface area and permeability can range, e.g., from tissue properties in lungs to rock porosity quantification. Such exemplary applications can be considered as an extension of the exemplary diffusion-weighted MRI applications described herein above, e.g., from water MRI to MRI using hyperpolarized gases. For example, developing exemplary maps of permeability of tissues for hyperpolarized gases (e.g., Helium or Xenon), and of exemplary surface-to-volume, can provide new valuable diagnostic information. Thus, it is likely that, e.g., only a time-dependent diffusivity D(t) measurement can have been utilized to determine surface area. According to certain exemplary embodiments of the system, method and computer-accessible medium according to the present disclosure, it is possible to utilize exemplary time-dependent kurtosis and/or frequency-dependent diffusivity, such as described herein above in, e.g., Section D and in the exemplary quantifying porosity of sedimentary rocks for characterizing carbonate reservoirs to, e.g., evaluate potential efficiency of oil production application described herein above.

The following example describes an exemplary embodiment of the present disclosure for using frequency-dependent conductivity, frequency-dependent diffusivity and/or time-dependent diffusion to e.g., determine permeability and to quantify ordering of permeable membranes in one-dimensional and/or quasi-one-dimensional structures.

Thus, in accordance with certain exemplary embodiments of the present disclosure, a substantially precise way of quantifying exemplary parameters of membranes can be used, e.g., when the effective spatial dimensionality of a sample is d=1. This can correspond, for example, to a case when the membranes can be stacked parallel to one another, and the diffusion and/or the conductivity is measured in a direction perpendicular to the stack. In such case, it is possible to, e.g., quantify the permeability and density of membranes, as well as how ordered the membranes are and/or can be in a stack.

For example, the measured low-frequency dispersive diffusivity can be fitted to, e.g., the exemplary asymptotic expression $D_{eff}(\omega)=D_0[1-i(nD_0/2\kappa)\lambda(\zeta/(1+\zeta))^{3/2}\sqrt{i\omega D_0}]$. This exemplary asymptotic expression can become exact (and/or, e.g., substantially exact) in the exemplary limit of $\omega\tau_r<1$, where $\tau_r=V/(SK)$ can represent the exemplary mean residence time within an interval between membranes. In this example, $n=V/2S=1/\bar{\alpha}$ can represent a density of exemplary membranes, and the parameter $\lambda=(\sigma/\bar{\alpha})^2$ can represent a ratio of an exemplary standard deviation $\sigma$ of lengths of exemplary intervals between the membranes to a mean interval length $\bar{\alpha}$. This exemplary parameter can describe the degree of ordering of the membranes in a single-dimensional sample, for example.

Similarly, an exemplary frequency-dependent conductivity $\sigma(\omega)$ can be fitted to the above exemplary asymptotic expression of this example with an exemplary identification of, e.g., $\sigma(\omega)=CD_{eff}(\omega)$ based on the Einstein relationship, for example. The exemplary coefficient C can represent, e.g., the product of the square of the electric charge of a current carrier, and/or the density of states of the electric carriers.

Further, according to certain exemplary embodiments of the present disclosure, an exemplary time-dependent diffusion coefficient can be fitted to, e.g., the exemplary asymptotic expression $D_{app}(t)=D_0[1+\lambda(\zeta/(1+\zeta))^{3/2}\sqrt{(2/\lambda)\tau_r/t}]$, which can become exact and/or substantially exact in an exemplary limit of, e.g.,.. t≫$\tau_r$.

An example can be that the exemplary square-root frequency dependence, and/or, equivalently, the exemplary inverse-square-root time dependence, which can be defining signatures of permeable membranes, can be quantitatively related to how randomly the membranes are distributed in space, for example. A measurement exemplary prefactor $\lambda$ from an exemplary conductivity and/or diffusivity fit can thus provide for an exemplary degree of structural irregularity of a sample to be quantified, for example.

The following exemplary embodiment according to the present disclosure can be used to address the problem of, e.g., what can be inferred about a packing geometry (e.g., ordering) of permeable membranes from a measured D(t), which exemplary problem can generally be considered to have heretofore been unresolved. One having ordinary skill in the art should appreciate from the following example, e.g., that the form of the exemplary probability distribution function (pdf) $p(\alpha)$ of exemplary intervals $\alpha_m=x_{m+1}-x_m$ between successive exemplary positions $x_m$ of membranes can significantly affect, e.g., the exemplary long-time limit of D(t). For example, by focusing on the way D(t) approaches the exemplary tortuosity asymptote $D_0=D/(1+\zeta)$, $\zeta=nD/\kappa$, where D can represent unrestricted diffusivity and $n=1/\bar{\alpha}$ can represent an exemplary membrane density, it can be possible to derive and/or determine an exemplary long-time asymptotic behavior, which can be expressed as, e.g., $$D_{app}(t)=D_0[1+\lambda(\zeta/(1+\zeta))^{3/2}\sqrt{(2/\pi)\tau_r/t}], \quad (19)$$

and to relate it to an exemplary q→0 limit of an exemplary Fourier transform $\Gamma(q)$ of an exemplary pair correlation function of exemplary membrane positions, where, e.g., $$\Gamma(q)|_{q\to 0}=\lambda n, \quad \lambda=(\sigma/\bar{\alpha})^2. \quad (20)$$

In this example, $\bar{\alpha}=\int p(\alpha)d\alpha$ and $\sigma$ can represent the exemplary mean and standard deviation of the exemplary interval length pdf $p(\alpha)$, and $\tau_r=\bar{\alpha}/(2\kappa)$ can represent the exemplary mean residence time within an exemplary interval. For completely uncorrelated membranes, the exemplary pdf $p(\alpha)=e^{-\alpha/\bar{\alpha}}/\bar{\alpha}$ can be Poissonian, with $\sigma=\bar{\alpha}$ and $\lambda=1$; and for an exemplary periodic arrangement, with $\lambda=0$, the leading $D_{app}(t)$ behavior can start with 1/t instead.

The above-described exemplary generated results agree with exemplary numerical simulations of, e.g., a one-dimensional random walk restricted by exemplary permeable membranes placed according to a variety of probability distributions $p(\alpha)$ of their intervals (e.g., between successive exemplary membranes). One having ordinary skill in the art should appreciate how the asymptotic limit of $D_{app}(t)$ can be insensitive to the shape of $p(\alpha)$ as long as its variance exists.

Figure 3:
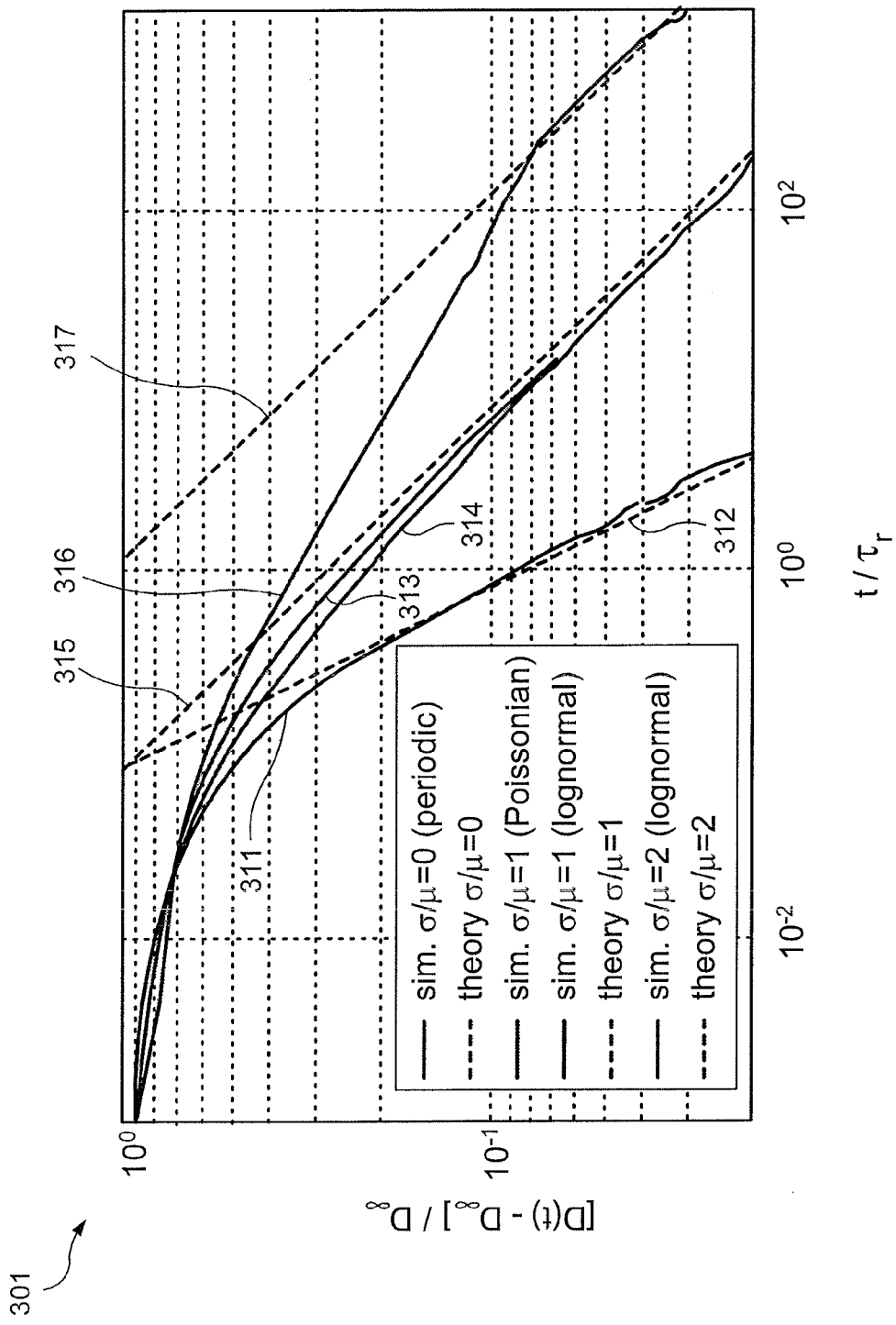
FIG. 3 is an illustration of a graph of exemplary simulations and generated results in accordance with certain exemplary embodiments of the present disclosure.

For example, FIG. 3 shows an exemplary illustration of a graph 301 of exemplary simulations and generated results in accordance with certain exemplary embodiments of the present disclosure. In this example, line 311 can represent an exemplary probability distribution function (pdf) of an exemplary periodic simulation with $\sigma/\mu=0$, line 312 can represent an exemplary pdf of an exemplary generated result with $\sigma/\mu=0$, line 313 can represent an exemplary pdf of an exemplary Poissonian simulation with $\sigma/\mu=1$, line 314 can represent an exemplary pdf of an exemplary lognormal simulation with $\sigma/\mu=1$, line 315 can represent an exemplary pdf of an exemplary generated result with $\sigma/\mu=1$, line 316 can represent an exemplary pdf of an exemplary lognormal simulation with $\sigma/\mu=2$, and line 317 can represent an exemplary pdf of an exemplary generated result with $\sigma/\mu=2$. As shown in, e.g., FIG. 3, the exemplary Poissonian pdf and the exemplary lognormal pdf with equal variance can yield substantially the same $D_{app}(t)$ limit (e.g., lines 313 and 314, respectively. Further, as shown in FIG. 3, the shape of $D_{app}(t)$ can change qualitatively when $\lambda$ vanishes (e.g., line 311).

In accordance to certain exemplary embodiments of the present disclosure, an exemplary variance σ can diverge when, e.g., an exemplary pdf $p(\alpha) \sim 1/\alpha^{1+\mu}$ has a "fat tail" (e.g., is of a Levy form). This can lead to, e.g., an exemplary power-law divergence of, e.g., en exemplary correlator $\Gamma(q)$ for q→0, and can cause an exemplary fractional dependence of the exemplary $D_{app}(t)$ asymptote, which can provide for, e.g., an exemplary determination of power μ of the exemplary Levy-stable pdf of exemplary intervals, for example.

Accordingly, in light of the exemplary embodiments of the present disclosure, an exemplary leading inverse-square-root time dependence (which can be a defining signature of exemplary permeable membranes) can be quantitatively related to how randomly the exemplary membranes can be distributed in space, for example. Further, it should be appreciated that measuring an exemplary prefactor λ in the exemplary time-dependence (e.g., exemplary Equation 19) can thus provide for quantifying an exemplary degree of structural irregularity of a sample. Moreover, for the ideally periodic arrangement of membranes, the exemplary prefactor λ=0 can vanish and the exemplary long-time asymptote can change to 1/t.

Figure 4:
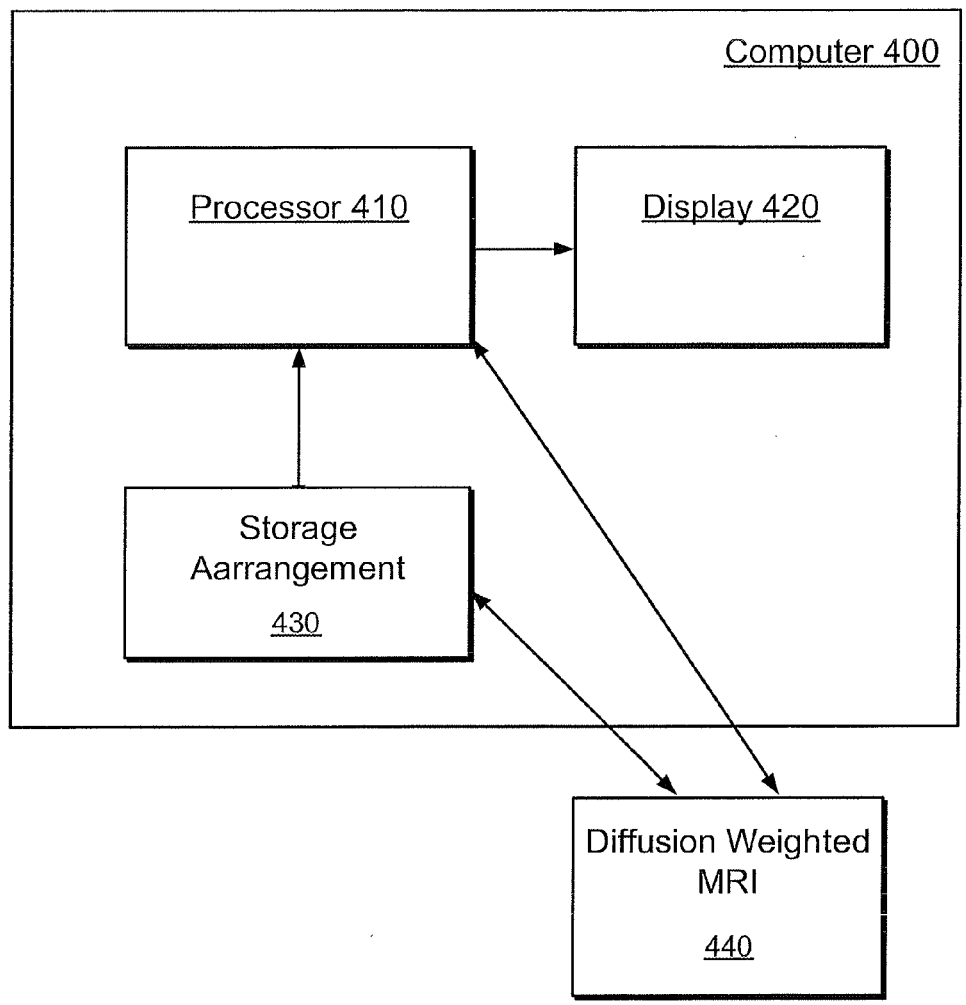
FIG. 4 is an illustration of a block diagram of a system in accordance with certain exemplary embodiments of the present disclosure.

FIG. 4 is an illustration of a block diagram of an exemplary embodiment of a system according to the present disclosure. For example, the system can include a computer 400 which include a processor/computer 410 configured or programmed to perform the exemplary steps and/or procedures of the exemplary embodiments of the techniques described above. For example, an external device, such as a diffusion weighted MRI device 440, can provide measurements to the processor 410. This data can be associated with, for example, at least one portion of an anatomical structure. Other sensors and/or external devices or arrangements can be used to provide various type of data, e.g., external processors, biological sensors, etc. According to one exemplary embodiment of the present disclosure, the data can be stored in a storage arrangement 430 (e.g., hard drive, memory device, such as RAM, ROM, memory stick, floppy drive, etc.).

The processor 410 can access a storage arrangement 430 to execute a computer program or a set of instructions (stored on or in the storage arrangement 430) which perform the procedures according to the exemplary embodiments of the present disclosure. Thus, e.g., when the processor 410 performs such instructions and/or computer program, the processor 410 can be configured to perform the exemplary embodiments of the procedures according to the present disclosure, as described above herein. For example, the processor 410 can receive information from the diffusion weighted MRI relating to the diffusivity of a sample. This information can be received directly from the diffusion weighted MRI device 440 and/or accessed from the storage arrangement. The processor 410 can then determine information relating to a permeability of a membrane and/or a measure of a total surface area of a membrane (or membranes) in a sample as a function of the received information.

A display 420 can also be provided for the exemplary system of FIG. 4. The storage arrangement 430 and the display 420 can be provided within the computer 400 or external from the computer 400. The information received by the processor 410 and further information determined by the processor 410, as well as additional information stored on the storage arrangement 430 can be displayed on the display 420 in a user-readable format.

FIG. 5 shows an illustration of a flow diagram of a procedure in accordance with certain exemplary embodiments of the present disclosure. As shown in FIG. 5, the exemplary procedure can be executed on and/or by, e.g., the processor 410, which can include, e.g., one or more micro-processors, a collection or an array thereof. Starting at subprocess 510, the exemplary procedure can, in subprocess 520, obtain particular information relating to transport properties of a material containing at least one membrane. In subprocess 530, the exemplary procedure can determine, e.g., (i) a permeability of the at least one membrane of the material, and/or (ii) a surface area of the at least one membrane of the material. According to certain exemplary embodiments of the present disclosure, the determination in subprocess 530 can be performed as a function of the particular information obtained in subprocess 520, for example.

The exemplary particular information in this exemplary embodiment can be obtained, e.g., without a direct access to the at least one exemplary membrane, e.g., with the use of an exemplary magnetic resonance imaging (MRI) procedure. The obtained exemplary information can include, e.g., an exemplary frequency-dependent transport characteristic of the material, an exemplary time-dependent transport characteristic of the material, information associated with an exemplary electrical conductivity of the material and/or an exemplary impedance of the material, and/or an exemplary diffusional measurement, which measurement can be, e.g., an exemplary diffusional kurtosis measurement, for example. It is also possible that the exemplary obtained particular information can include, e.g., data received from an exemplary diffusion-weighted imaging (DWI) signal.

Further, according to certain exemplary embodiments, the at least one membrane can include a plurality of membranes which can be, e.g., (i) unordered, (ii) spaced unequally and/or (iii) uncorrelated. The exemplary determination procedure can be performed, e.g., by fitting the exemplary particular information to an exemplary function of surface area and/or permeability of the one or more exemplary membranes.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and methods which, although not explicitly shown or described herein, embody the principles of the disclosure and are thus within the spirit and scope of the disclosure. In addition, all publications and references referred to above are incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement which can be a microprocessor, mini, macro, mainframe, etc. In addition, to the extent that the prior art knowledge has not been explicitly incorporated by reference herein above, it is explicitly being incorporated herein in its entirety. All publications referenced above are incorporated herein by reference in their entireties.

What is claimed is:

1. A non-transitory computer-accessible medium having instructions thereon, wherein, when a computing arrangement executes the instructions, the computing arrangement is configured to execute procedures comprising:
(a) causing an activation of an apparatus that measures at least one transport property of a material containing at least one membrane, wherein the apparatus includes one of (i) a magnetic resonance imaging apparatus, (ii) a nuclear magnetic resonance apparatus or (iii) an electron spin resonance apparatus;
(b) obtaining particular information from the apparatus relating to the at least one transport property of the a material; and (c) determining at least one of a (i) a permeability of the at least one membrane, or (ii) a surface area of the at least one membrane, as a function of the obtained particular information and a diffusivity model given by the following expression:

$$\frac{D}{D_{eff}(\omega)} = 1 + \zeta + 2z(1-z)\left[\sqrt{1 + \zeta/(1-z)^2} - 1\right],$$

where (i) $D_{eff}(\omega)$ is a frequency-dependent complex-valued effective diffusivity, (ii) D is a free diffusivity, (iii) $\zeta=(S/V)(1/d)$, where S/V is a surface to volume ratio, d is a spatial dimension and, $1=D/(2\kappa)$, where $\kappa$ is a permeability, and (iv) $z=i(i\omega\tau)^{1/2}$, where i is an imaginary unity, $\omega$ is a frequency and $\tau=D/(2\kappa)^2$.

2. The computer-accessible medium of claim 1, wherein the apparatus measures the at least one transport property without a direct access to the at least one membrane.

3. The computer-accessible medium of claim 1, wherein the obtained particular information includes a frequency-dependent transport characteristic of the material.

4. The computer-accessible medium of claim 1, wherein the obtained particular information includes a time-dependent transport characteristic of the material.

5. The computer-accessible medium of claim 1, wherein the obtained particular information includes at least one of an electrical conductivity or an impedance information of the material.

6. The computer-accessible medium of claim 5, wherein the obtained particular information includes further information for a diffusional measurement of the material.

7. The computer-accessible medium of claim 6, wherein the obtained particular information of the at least one membrane includes data associated with a diffusion-weighted imaging (DWI) signal.

8. The computer-accessible medium of claim 6, wherein the diffusional measurement is a diffusional kurtosis measurement.

9. The computer-accessible medium of claim 6, wherein the computing arrangement is further configured to utilize at least one of a long-time behavior or a low-frequency behavior with respect to at least one one-dimensional formula using at least one of (i) a measured time-dependent diffusion coefficient, (ii) a frequency-dependent diffusivity, or (iii) a frequency dependent conductivity, to determine a parameter that characterizes a ratio of an inter-membrane interval dispersion over a mean inter-membrane interval associated with the at least one membrane.

10. The computer-accessible medium of claim 1, wherein the at least one membrane includes a plurality of membranes which are at least one of (i) unordered, (ii) spaced unequally or (iii) uncorrelated.

11. The computer-accessible medium of claim 1, wherein the determining procedure is performed by the computing arrangement by fitting the particular information to a function of the surface area and the permeability.

12. The computer-accessible medium of claim 1, wherein the diffusivity model is a frequency-dependent diffusivity model.

13. The computer-accessible medium of claim 1, wherein the diffusivity model is based on at least one of at least one further permeability and at least one further surface area of at least one further membrane.

14. The computer-accessible medium of claim 1, wherein the diffusivity model is based on at least one free diffusion coefficient.

15. The computer-accessible medium of claim 1, wherein the determination procedure is performed by fitting the diffusivity model to the obtained particular information.

16. The computer-accessible medium of claim 15, wherein the computer arrangement is further configured to determine the obtained particular information using at least one oscillating gradient in a frequency domain, and wherein the fitting of the diffusivity model to the obtained particular information is performed on a real portion of the obtained particular information.

17. The computer-accessible medium of claim 15, wherein the computer arrangement is further configured to determine the obtained particular information using a pulse-gradient procedure in a time domain.

18. A method for determining at least one transport property of a material, comprising:
(a) causing an activation of an apparatus that measures at least one transport property of a material containing at least one membrane, wherein the apparatus includes one of (i) a magnetic resonance imaging apparatus, (ii) a nuclear magnetic resonance apparatus or (iii) an electron spin resonance apparatus;
(b) obtaining particular information from the apparatus relating to the at least one transport property of a material containing at least one membrane; and
(c) using a computer hardware arrangement, determining at least one of a (i) a permeability of the at least one membrane, or (ii) a surface area of the at least one membrane, as a function of the obtained particular information and a diffusivity model given by the following expression:

$$\frac{D}{D_{eff}(\omega)} = 1 + \zeta + 2z(1-z)\left[\sqrt{1 + \zeta/(1-z)^2} - 1\right],$$

where (i) $D_{eff}(\omega)$ is a frequency-dependent complex-valued effective diffusivity, (ii) D is a free diffusivity, (iii) $\zeta=(S/V)(1/d)$, where S/V is a surface to volume ratio, d is a spatial dimension and, $1=D/(2\kappa)$, where $\kappa$ is a permeability, and (iv) $z=i(i\omega\tau)^{1/2}$, where i is an imaginary unity, $\omega$ is a frequency and $\tau=D/(2\kappa)^2$.

19. The method of claim 18, wherein the apparatus measures the at least one transport property a direct access to the at least one membrane.

20. The method of claim 18, wherein the obtained particular information includes a frequency-dependent transport characteristic of the material.

21. The method of claim 18, wherein the obtained particular information includes a time-dependent transport characteristic of the material.

22. The method of claim 18, further comprising at least one of displaying or storing information associated with at least one of a (i) the permeability, or (ii) the surface area, in a storage arrangement in at least one of a user-accessible format or a user-readable format.

23. The method of claim 18, wherein the obtained particular information includes further information for a diffusional measurement of the material.

24. The method of claim 23, further comprising utilizing at least one of a long-time behavior or a low-frequency behavior with respect to at least one one-dimensional formula using at least one of (i) a measured time-dependent diffusion coefficient, (ii) a frequency-dependent diffusivity, or (iii) a frequency-dependent conductivity, to determine a parameter that characterizes a ratio of an inter-membrane interval dispersion over a mean inter-membrane interval associated with the at least one membrane.

25. The method of claim 18, wherein the diffusivity model is a frequency-dependent diffusivity model.

26. The method of claim 18, wherein the diffusivity model is based on at least one of at least one further permeability and at least one further surface area of at least one further membrane.

27. The method of claim 18, wherein the diffusivity model is based on at least one free diffusion coefficient.

28. The method of claim 18, wherein the determination procedure is performed by fitting the diffusivity model to the obtained particular information.

29. The method of claim 28, further comprising determining the obtained particular information using at least one oscillating gradient in a frequency domain, and wherein the fitting of the diffusivity model to the particular information is performed on a real portion of the obtained particular information.

30. The method of claim 28, further comprising determining the particular information using a pulse-gradient procedure in a time domain.

31. A system for at least one transport property of a material, comprising:
a non-transitory computer-accessible medium having executable instructions thereon, wherein when at least one computing arrangement executes the instructions, the at least one computing arrangement is configured to:
(a) cause an activation of at least one scan of a material containing at least one membrane, wherein the apparatus includes one of (i) a magnetic resonance imaging apparatus, (ii) a nuclear magnetic resonance apparatus or (iii) an electron spin resonance apparatus;
(b) obtain particular information relating to at least one transport property of a material containing at least one membrane; and
(c) determine at least one of a (i) a permeability of the at least one membrane, or (ii) a surface area of the at least one membrane, as a function of the obtained particular information and a diffusivity model given by the following expression:

$$\frac{D}{D_{\mathit{eff}}(\omega)} = 1 + \zeta + 2z(1-z)\left[\sqrt{1+\zeta/(1-z)^2} - 1\right],$$

where (i) $D_{\mathit{eff}}(\omega)$ is a frequency-dependent complex-valued effective diffusivity, (ii) D is a free diffusivity, (iii) $\zeta = (S/V)(1/d)$, where S/V is a surface to volume ratio, d is a spatial dimension and, $1 = D/(2\kappa)$, where $\kappa$ is a permeability, and (iv) $z = i(i\omega\tau)^{1/2}$, where i is an imaginary unity, $\omega$ is a frequency and $\tau = D/(2\kappa)^2$.

32. The system of claim 31, wherein the apparatus measures the at least one transport property without a direct access to the at least one membrane.

33. The system of claim 31, wherein the obtained particular information includes a frequency-dependent transport characteristic of the material.

34. The system of claim 31, wherein the obtained particular information includes a time-dependent transport characteristic of the material.

35. The system of claim 31, wherein the obtained particular information includes further information for a diffusional measurement of the material.

36. The system of claim 35, wherein the computing arrangement is further configured to utilize at least one of a long-time behavior or a low-frequency behavior with respect to at least one one-dimensional formula using at least one of (i) a measured time-dependent diffusion coefficient, (ii) a frequency-dependent diffusivity, or (iii) a frequency-dependent conductivity, to determine a parameter that characterizes a ratio of an inter-membrane interval dispersion over a mean inter-membrane interval associated with the at least one membrane.

37. The system of claim 31, wherein the diffusivity model is a frequency-dependent diffusivity model.

38. The system of claim 31, wherein the diffusivity model is based on at least one of at least one further permeability and at least one further surface area of at least one further membrane.

39. The system of claim 31, wherein the diffusivity model is based on at least one free diffusion coefficient.

40. The system of claim 31, wherein the determination procedure is performed by fitting the diffusivity model to the obtained particular information.

41. The system of claim 40, wherein the computer arrangement is further configured to determine the obtained particular information using at least one oscillating gradient in a frequency domain, and wherein the fitting of the diffusivity model to the particular information is performed on a real portion of the obtained particular information.

42. The system of claim 40, wherein the computer arrangement is further configured to determine the particular information using a pulse-gradient procedure in a time domain.

* * * * *